United States Patent
Geissler et al.

(10) Patent No.: US 6,238,529 B1
(45) Date of Patent: May 29, 2001

(54) DEVICE FOR ELECTROLYTIC TREATMENT OF PRINTED CIRCUIT BOARDS AND CONDUCTIVE FILMS

(75) Inventors: Jens Geissler, Berlin; Thomas Rydlewski, Nürnberg; Lorenz Kopp; Ralf-Peter Wächter, both of Altdorf; Reinhard Schneider, Cadolzburg, all of (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 09/403,657

(22) PCT Filed: Apr. 7, 1998

(86) PCT No.: PCT/DE98/01034
§ 371 Date: Nov. 22, 1999
§ 102(e) Date: Nov. 22, 1999

(87) PCT Pub. No.: WO98/49374
PCT Pub. Date: Nov. 5, 1998

(30) Foreign Application Priority Data

Apr. 25, 1997 (DE) ............................................. 197 17 512

(51) Int. Cl.[7] .................................................. C25D 17/00
(52) U.S. Cl. ....................................... 204/202; 204/224 R
(58) Field of Search ................................... 204/206, 202, 204/224 R

(56) References Cited

U.S. PATENT DOCUMENTS

| | | | |
|---|---|---|---|
| 4,559,123 | * 12/1985 | Moore et al. | ........................ 204/206 |
| 4,986,888 | 1/1991 | Hosten et al. | |
| 5,425,862 | * 6/1995 | Hartmeann et al. | ................. 204/207 |
| 5,658,441 | * 8/1997 | Spain et al. | ........................... 204/203 |

FOREIGN PATENT DOCUMENTS

| | | |
|---|---|---|
| 38 23 072 | 7/1988 | (DE) . |
| 39 39 681 | 6/1991 | (DE) . |
| 43 24 330 | 7/1993 | (DE) . |
| 42 12 567 | 9/1993 | (DE) . |
| 44 02 596 | 1/1994 | (DE) . |
| 42 29 403 | 3/1994 | (DE) . |
| 43 44 387 | 6/1995 | (DE) . |
| 58-123898 | 7/1983 | (JP) . |
| 62-774495 | 10/1985 | (JP) . |

* cited by examiner

Primary Examiner—Kathryn Gorgos
Assistant Examiner—Erica Smith-Hicks
(74) Attorney, Agent, or Firm—Paul & Paul

(57) ABSTRACT

The apparatus for electrolytically treating printed circuit boards 3, through which apparatus the printed circuit boards are continuously guidable in a plane of conveyance in a substantially horizontal direction of conveyance, has the following features: Counter-electrodes 1,2 are disposed opposite the plane of conveyance and substantially parallel thereto on at least one side, so that electrolytic chambers 4,5 are formed between counter-electrodes, which are situated opposite one another, or between the counter-electrodes and the plane of conveyance, the counter-electrodes forming respective substantially continuous electrode faces. Guide elements 7,8 for the printed circuit boards are disposed in the electrolytic chamber. Contact elements 11 are provided for the electrical contacting of the printed circuit boards. Electrolyte spraying arrangements 13 are also provided for conveying the electrolytic fluid towards the surfaces of the printed circuit boards. Openings are provided in the counter-electrodes. The electrolyte spraying arrangements are disposed on the sides of the counter-electrodes remote from the plane of conveyance in such a manner that electrolytic fluid, emerging from the arrangements, can pass the counter-electrodes substantially unhindered at the locations of the openings and can pass to the surfaces of the printed circuit boards.

9 Claims, 2 Drawing Sheets

DEVICE FOR ELECTROLYTIC TREATMENT OF PRINTED CIRCUIT BOARDS AND CONDUCTIVE FILMS

DESCRIPTION

The invention relates to an apparatus for electrolytically treating printed circuit boards and conductor foils in horizontal or vertical continuous electroplating systems by using direct current or pulse current. The apparatus is especially suitable for the uniform electrolytic deposition of metal layers with optimised metal-physical properties.

It is well-known, for electrolytic metallisation, that electrolytic fluid must be brought to the surface of the item to be metallised in order to counter-control the consumption of the required metal ions. In such case, the requirement for metal ions per unit of time increases with an increasing current density. For such purpose, according to known methods, a flow of fluid is utilised, which is directed towards the surface of the item to be treated in order to reduce the thickness of the diffusion layer, which abuts against the surface, and thus to accelerate the conveyance of metal ions to the surface of the item to be treated. In practical usage, however, there are limits for directing the flow to the surfaces, which limits exist because of the design of the electroplating system and the nature of the item to be treated. It is not even possible, for example, to treat thin and, hence, mechanically inadequately stable conductor foils with desirably intense fluid jets. Ideally, the conveyance of the treatment fluid should be able to pass as uniformly as possible to all of the surface locations of the item to be treated situated in the electroplating system.

Furthermore, where possible, electrical screening by components of the system should be avoided. In known electroplating systems, however, this is not achieved. Whilst the item to be treated passes through the system, considerably different local current density values are often set at the treated locations, and such values result from the system components, for example electrolyte inlet pipes and nozzles, and/or from gaps between the anodes.

More especially with so-called high-performance electrolytes, which are particularly well-suited for depositing metal at high current densities, variable current densities have a considerable effect on the quality of the metal layers deposited. In consequence, high-quality printed circuit boards can practically only be produced with these electrolytes when the current density remains identical at all of the locations of the item to be treated during the entire electrolysis. If the current density is not kept within a narrow range, layers are formed, for example, with an unsatisfactory breaking elongation and surface quality. Varying current densities also, of course, lead to a non-uniform layer thickness distribution both from board to board and at various locations of the same printed circuit board. For example, only matt and rough layers are deposited during the deposition of copper with a current density of 7.5 $A/dm^2$ when the deposition electrolyte has a composition whereby a high-quality layer can be produced at a current density of 5 $A/dm^2$.

In DE 42 12 567 A1, an electroplating arrangement for printed circuit boards is described, in which the printed circuit boards are guided along a horizontal continuous path through a treatment chamber, contacting means being provided, which are disposed in the region of the continuous path and grip the printed circuit boards at the front edge in their continuous path. Soluble anodes are provided opposite the plane of conveyance, in which the printed circuit boards are guided. It is also stated that surge nozzles are disposed between the individual anodes and direct the treatment fluid towards the surfaces of the printed circuit boards. However, a system of this type of construction is not suitable for depositing metal at high current densities and for meeting high demands regarding quality.

A horizontal continuous system for electrolytically treating printed circuit boards is described, inter alia, in DE 43 44 387 C2, wherein the printed circuit boards are guided through the system in a horizontal plane of conveyance and direction of conveyance, and insoluble anodes are provided opposite the plane of conveyance. Suitable contacting means in the treatment chamber are used for current supply purposes. During the conveyance of the printed circuit boards through the system, the treatment fluid is conveyed towards the surfaces of said boards via flood tubes. According to the statements made in this publication, the flood tubes and the supply lines for the flood tubes are formed from plastics material in order to minimise the effect of the electrical field between anode and cathode. However, it is assumed that an effect occurs, but the electrical screening effect is estimated to be minimal because the item to be treated would move slowly through the system and, in consequence, would continuously be exposed to the variable electrical fields.

A continuous system for coating plastics material films with metal is described in DE 42 29 403 C2. The item to be treated is drawn through chambers, which can be charged with electrolyte, anodes being disposed opposite the film. The treatment fluid is conveyed through bores in the anodes, which bores are provided so as to lead to the film and so as to extend in an inclined manner when viewed with respect to the direction of conveyance, and said fluid is directed onto the film surfaces. Moreover, an open-pore plastics material is provided internally of the chamber and is brought into contact with the drawn-through film. Furthermore, squeeze rollers are provided in the publication for partitioning the chamber, which rollers serve to prevent the escape of treatment fluid and are disposed at the inlet and outlet of the film. Moreover, it is described that a plurality of chambers are connected in series with one another. It has become apparent that, with such a system, it is not possible to deposit any high-quality metal layers and, more especially, this is not possible when high mean current densities are used.

A horizontal continuous system for treating printed circuit boards is also mentioned in DE 44 02 596 A1. To increase the usable current density, electrolyte from the nearest vicinity is conveyed to the surface of the printed circuit board, in that a rotating flood electrode is used which travels along the surface of the printed circuit board, and the electrolyte emerges from said surface under pressure. This electrode simultaneously also serves as the counter-electrode. Alternatively, the electrolyte may also be removed by suction via the flood electrode. An intense flow at the surfaces of the printed circuit boards is also produced thereby. However, it has become apparent that, when the rotating flood electrodes are used, no high-quality metal layers can be deposited at a high mean current density.

An apparatus is described in DE 43 24 330 A1, which is similar to that in DE 44 02 596 A1. As distinct from the latter, the flood electrode does not travel along the surfaces of the printed circuit boards in a non-slip manner. Rather, the flood electrode is wiped over the surface of the printed circuit board, so that the thickness of the diffusion layer is additionally disturbed with the possibility of a further increase in the limiting current density. However, this apparatus has other disadvantages. For example, the wiping movement leads to an increased wear of the wiping means on the electrode periphery, so that the electrolyte and, hence, the item to be treated easily become contaminated. Moreover, the wiping means needs to be replaced frequently, as a consequence, so that the apparatus has to be maintained with an increased outlay. In this case, it has also been ascertained that metal layers could not be deposited with a high degree of quality when the operation was accomplished with a high mean current density.

A system for electrolytically coating strip steel with metals is described in JP-A-58123898, wherein the strip steel is conducted continuously through an electrolytic chamber and guided closely past anodes. Electrolyte is guided, via pipelines, into anode chambers which are disposed on the side of the anodes remote from the strip steel. The electrolyte is conveyed from the chambers to the strip steel via slots in the anodes.

In consequence, the basic object of the present invention is to avoid the disadvantages of prior art, and, more especially, to find a suitable apparatus for electrolytically treating printed circuit boards and conductor foils, more especially for electrolytic metallisation. Above all, it should be possible to produce metal layers with very good metal-physical properties, for example with a large breaking elongation and ductility, a very good shine, a uniform layer thickness, an adequate smoothening and a good throwing power during the deposition of layers in fine boreholes in the printed circuit boards, for example holes with a diameter of 0.3 mm and less, and possibly with a board thickness of 3.5 mm and more. More especially, these properties should be achievable even when the metal layers are deposited on the surfaces with a current density of at least 4 $A/dm^2$.

In the apparatus according to the invention, the printed circuit boards or conductor foils are treated with an electrolytic fluid, the printed circuit boards or conductor foils being continuously guided through the apparatus in a plane of conveyance in a substantially horizontal direction of conveyance. The apparatus has the following features:

(1) Counter-electrodes are disposed opposite the plane of conveyance and substantially parallel thereto on at least one side, so that electrolytic chambers are formed between counter-electrodes, which are situated opposite one another, or between the counter-electrodes and the plane of conveyance, the counter-electrodes forming respective substantially continuous electrode faces.

(2) Guide elements for the printed circuit boards and conductor foils are disposed in the electrolytic chamber.

(3) Contact elements are provided for the electrical contacting of the printed circuit boards and conductor foils.

(4) Electrolyte spraying arrangements as well as arrangements, such as pumps and pipelines, are also provided for conveying the electrolytic fluid towards the surfaces of the printed circuit boards and conductor foils.

(5) Openings are provided in the counter-electrodes.

(6) The electrolyte spraying arrangements externally of the electrolytic chambers on the sides of the counter-electrodes remote from the plane of conveyance are disposed in such a manner that the electrolytic fluid, emerging from the electrolyte spraying arrangements, can pass the counter-electrodes substantially unhindered at the locations of the openings and can pass to the surfaces of the printed circuit boards and conductor foils.

The printed circuit boards or conductor foils are preferably guided in a substantially horizontal or vertical orientation (horizontally or vertically orientated plane of conveyance).

For the electrolytic treatment, either copper can be deposited on the surfaces of printed circuit boards or conductor foils, or metal can be electrolytically etched-away from metal surfaces. In the first case the counter-electrodes are polarised as the anodes, and in the second case they are polarised as the cathodes.

The openings in the counter-electrodes are preferably cylindrical, but they may also have, for example, a square or rectangular cross-section. The axes of the openings are substantially in alignment with the fluid jets emerging from the electrolyte spraying arrangements, whereby the axes may be orientated substantially perpendicularly relative to the plane of conveyance.

In the apparatus according to the invention, a plurality of electrolyte spraying arrangements may be provided. More especially, a plurality of such arrangements may be disposed both perpendicularly and parallel to the direction of conveyance. In a preferred embodiment, the electrolyte spraying arrangements are offset from one another, when viewed with respect to the direction of conveyance, so as to achieve as wide a covering of the surfaces of the printed circuit boards or conductor foils as possible.

Since, in the case of printed circuit boards which are guided in the horizontal plane of conveyance, the electrolytic fluid is conveyed along their horizontally orientated surfaces, the fluid can only flow-away at the lateral edges of the printed circuit boards and, in consequence, accumulates in the central region of the boards. In consequence, a non-uniform velocity profile development of the electrolytic fluid, conveyed to the upper sides of the printed circuit boards, is formed transversely relative to the direction of conveyance without further optimisation of the apparatus. The velocity is low in the centre of the printed circuit boards, but high at the lateral edge of the printed circuit boards. This effect does not occur with printed circuit boards which are guided in a vertically orientated plane of conveyance. In order to compensate for the disadvantageous effect when printed circuit boards are guided in the horizontal plane of conveyance, the spacing between the electrolyte spraying arrangements should be so dimensioned that the flow velocity of the electrolytic fluid in the plane of conveyance is substantially identical at all of the locations. The spacing between the electrolyte spraying arrangements is advantageously selected to be smaller in the centre than at the lateral edge of the printed circuit boards.

The guide elements, disposed in the electrolytic chamber, may be offset from one another, when viewed with respect to the direction of conveyance, in order to minimise any disturbance in the deposition of metal at specific surface locations. The guide elements are preferably configured as discs which are disposed on spindles. The spindles extend perpendicularly relative to the direction of conveyance and parallel to the plane of conveyance. If possible, the dimensions and the material of the discs should be so selected that they do not substantially affect the electrical field line distribution in the electrolytic chambers. For example, discs formed from plastics material are particularly suitable, provided that such material is resistant to the electrolytic fluid. Moreover, the discs should be as thin as possible and, if possible, should have many openings in order to disturb the electrical field line distribution in the vicinity of the plane of conveyance as little as possible. A lower limit for the dimensioning of the discs is set by their necessary mechanical stability.

Also, in order to prevent treatment fluid from emerging from the apparatus, sealing means are provided at the inlet and at the outlet of the apparatus for the printed circuit boards and conductor foils. Squeeze rollers may be used, for example, as the sealing means, which are respectively mounted above or beneath the plane of conveyance and abut firmly against the boards or foils during the passage of the latter. In such a configuration, it has been ascertained that the current density increases sharply in the vicinity of the sealing means ("edge effect") and, in consequence, different deposition conditions prevail at these locations than exist between the inlet and the outlet. In order to overcome this disadvantage, the counter-electrodes are disposed so far remote from the sealing means that a current density, adapted to locations in the vicinity of the inlet and of the outlet of the printed circuit boards and conductor foils, is substantially exactly identical to the mean current density between these locations.

In the case where a relatively long system is conceived, which system should also have elongate counter-electrodes when viewed with respect to the direction of conveyance, the counter-electrodes comprise a plurality of individual component parts for structural reasons. In this case, suitable spacer strips and/or seals are to be provided between the individual electrodes in order to isolate the electrodes from one another.

The invention is explained hereinafter with reference to FIGS. 1 and 2. In detail:

Figure 1:
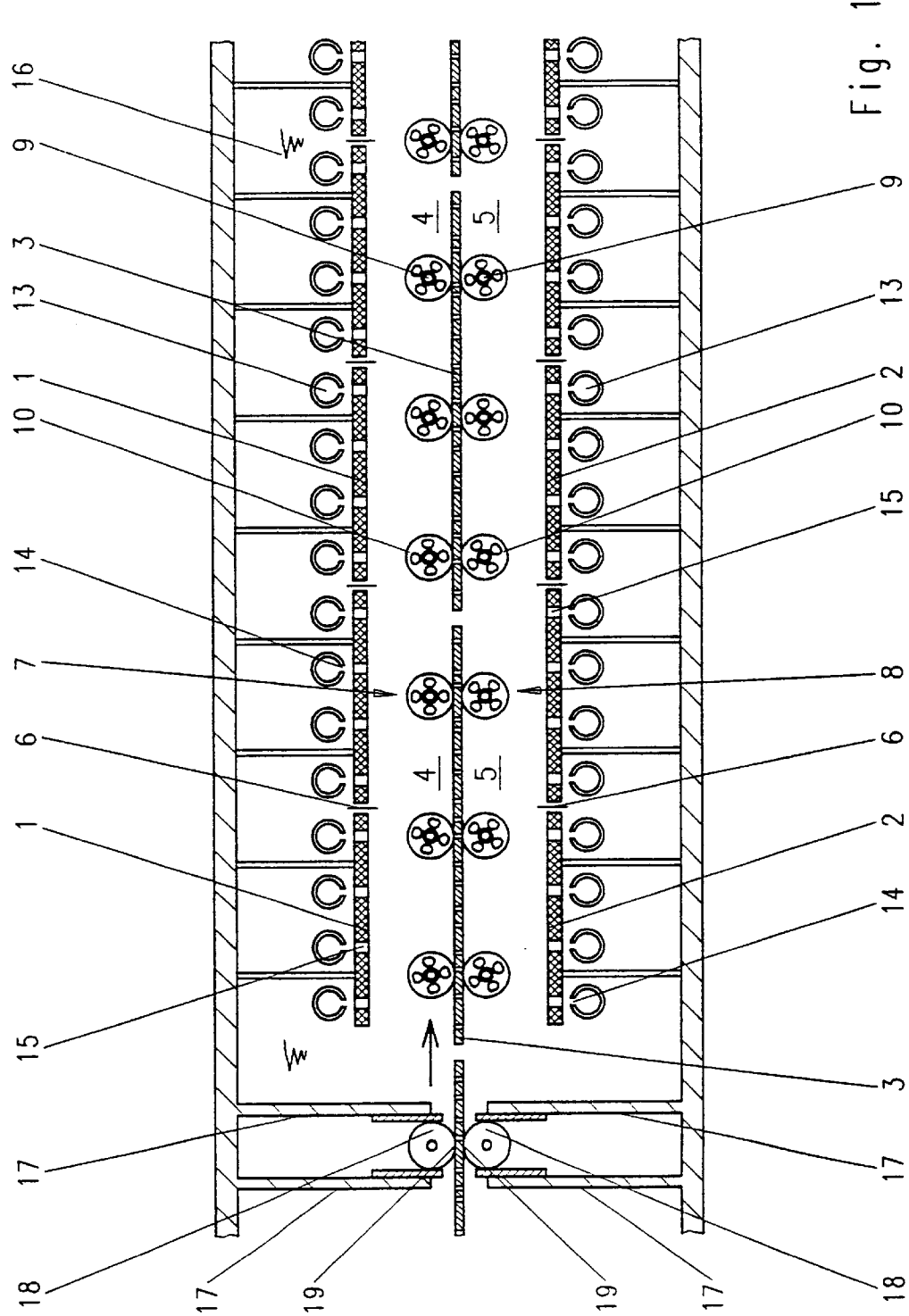
FIG. 1 is a schematic longitudinal sectional view of a portion of a horizontal continuous system according to the invention.

FIG. 1 illustrates a portion of the apparatus according to the invention. This portion is the inlet region of the system with the direction of conveyance extending from left to right in the direction of the arrow. To simplify the drawing, only four upper and four lower insoluble anodes 2 are illustrated as the counter-electrodes. In practice, for example, such a system includes twenty-five upper anodes 1 and twenty-five lower anodes 2. The total length of the active region of such a system, i.e. the region where an electrolytic treatment occurs by applying an electric voltage to the counter-electrodes and the item to be treated, is six metres. The anodes are illustrated as partial anodes of the entire upper electrolytic cell, which is formed by the upper anodes 1, the printed circuit boards or conductor foils 3 and the upper electrolytic chamber 4 situated therebetween. Equally, the partial anodes 2 of the lower electrolytic cell are also illustrated. This permits the individual switching-on of each anode 1, 2 when the item to be treated 3 enters the system, and also permits the individual switching-off of the anodes when the item leaves the system. The switching-on and-off of the anodes is described more especially in DE 39 39 681 C2. Reference is made to this publication. The bath current connection with the anodes 1, 2 is not illustrated in FIG. 1 in order to simplify the drawing.

Electrically insulating spacer strips and/or seals 6 are inserted between the anodes 1, 2. Said strips and/or seals are so narrow, when viewed with respect to the direction of conveyance, that the partial anodes 1, 2 act collectively as one continuous large anode 1, 2 with reference to the item to be treated 3. A drop in current density at the surface of the item to be treated, which drop might be caused by these anode spacings, cannot be ascertained. Moreover, the anodes 1, 2 extend substantially over the entire width of the item to be treated 3, but at least over 80% of this width, in order to avoid an edge effect during the deposition of metal. With a less differentiated switching-on and-off of the anodes, the length of the individual anodes can be increased when viewed with respect to the direction of conveyance. Limits are set only because of functional viewpoints in respect of manufacture.

Titanium, for example, is suitable as the material for the insoluble anodes 1, 2 and is coated with a protective covering, formed for example from iridium oxide, in order to reduce the excessive voltage during the deposition to a minimum. In order to enlarge the effective anode surface, such can be structured. The anodic current density is hereby reduced. Single-layered or multi-layered expanded metal lattices are preferably used for this purpose. The apparatus according to the invention is also suitable for the use of soluble anodes. For example, so-called pellets or even balls (spheres) may be used, which are formed from the metal to be deposited and are inserted into corresponding insoluble anode cages, or even anode plates may be used, which are formed from the metal to be deposited.

The printed circuit boards and conductor foils 3 to be treated are preferably guided centrally by upper guide elements 7 and lower guide elements 8 between the upper anodes 1 and the lower anodes 2 and are conveyed in the direction of conveyance by clips, which are not illustrated in FIG. 1 and also serve as electrical contact elements.

The driven or non-driven guide elements 7, 8 are generally electrically insulated, thin spindles 9 with perforated discs 10, formed from electrically non-conductive plastics material, mounted thereon. The spindles 9 and the discs 10 are so dimensioned that there is no electrically interfering screening of the item to be treated 3. The spindle diameter is substantially 10 millimetres, for example. The perforated discs 10 may have a thickness of substantially four millimetres, for example. The discs 10 are preferably disposed in an offset manner when viewed from spindle to spindle 9 in the direction of conveyance of the item to be treated 3. The mutual spacing between the spindles is generally, for example, substantially 250 millimetres, and the spacing between the discs on one spindle is, for example, substantially 100 millimetres. As a result of these measures, there is no disturbing effect on the electrolytic treatment by the guide elements 7, 8, for example metal deposition.

Figure 2A:
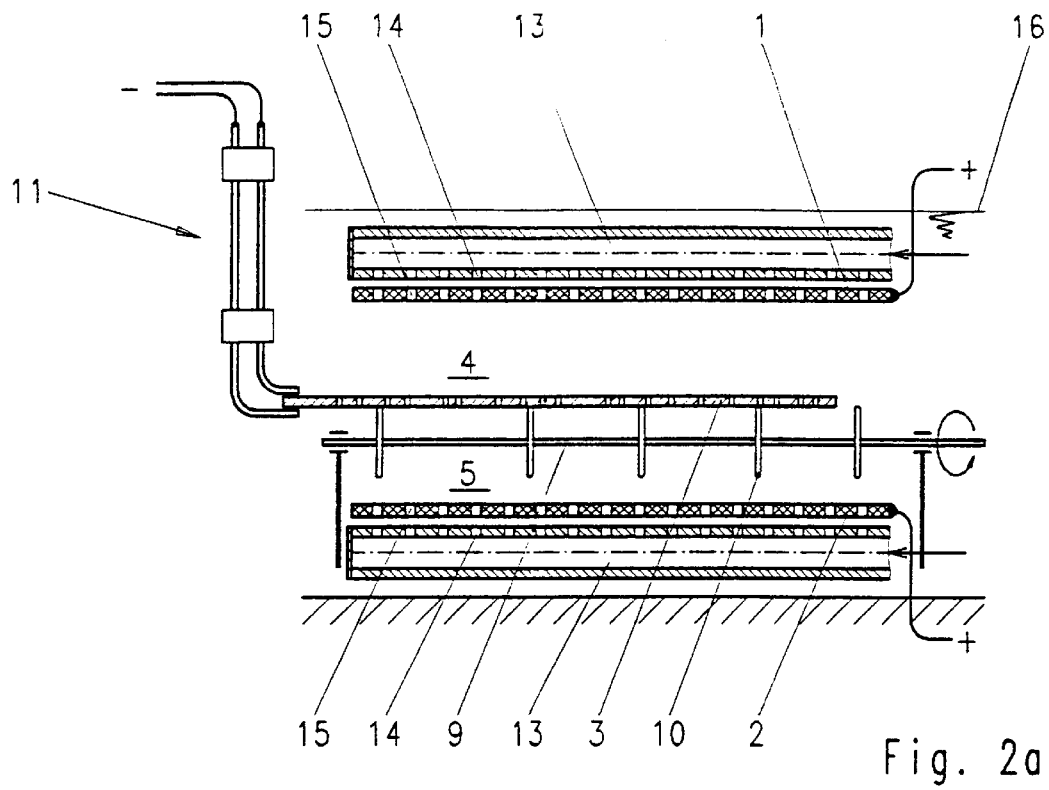
FIG. 2a is a schematic cross-sectional view through a continuous system having a clip-type contact with the item to be treated.

If only printed circuit boards and no thin conductor foils are involved in a continuous system, the upper guide elements 7 can be totally eliminated. This is shown more fully in the embodiment of FIG. 2a.

Figure 2B:
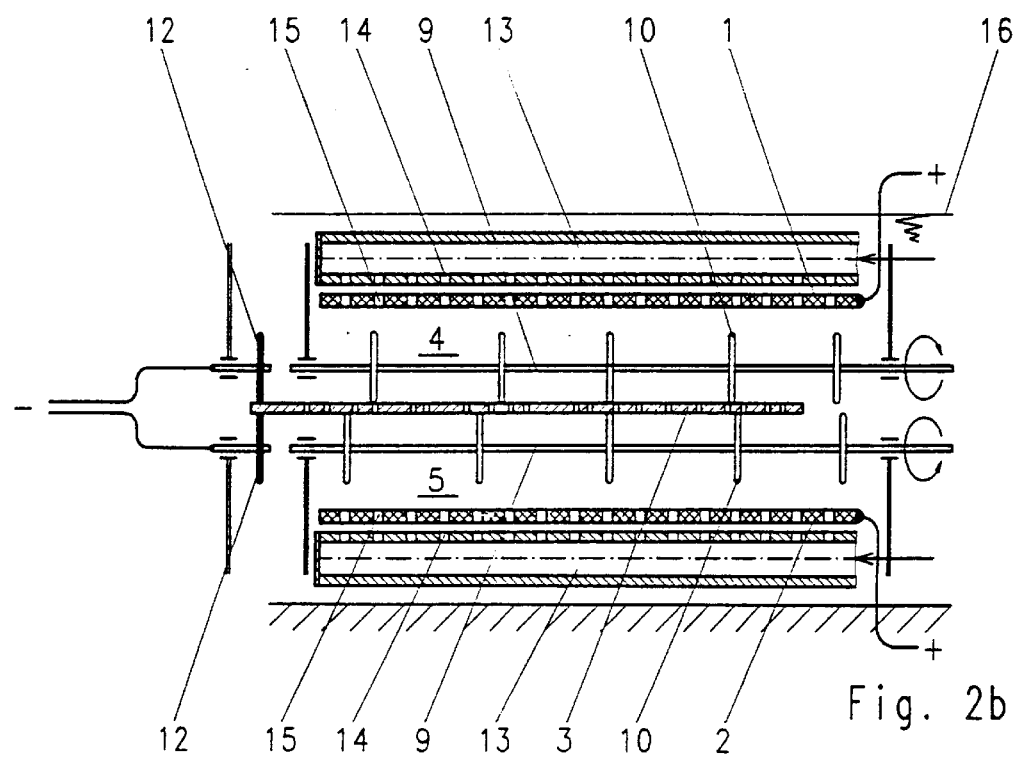
FIG. 2b is a schematic cross-sectional view through a continuous system having a roller-type contact with the item to be treated.

The item to be treated 3 must be electrically contacted and connected to a bath current source. Contacting clips 11 are used for this purpose and engage with the edge of the item to be treated 3, or other contact elements are used therefor. The electrical connection between the clips 11, which travel jointly with the item to be treated 3, and the bath current source is provided via sliding contacts, which are not illustrated in the Figures. Also, the linearly driven contacting clips 11 assume the function of conveyance for the printed circuit boards or conductor foils. The firmly gripped boards or foils are reliably conveyed through the electroplating system even when the guide elements 7, 8 are not driven. FIG. 2b illustrates the contacting of the item to be treated 3 via electrically conductive roller contacts 12. Since the item to be treated cannot be conveyed with roller contacts, the guide elements 7, 8 have to be driven in this case and disposed on each side of the plane of conveyance.

In the case of the Figures where the electrolyte spraying arrangements are configured as electrolyte spraying tubes 13, such arrangements are disposed externally of the electrolytic chambers 4, 5 in all of the cases, that is to say disposed on the sides of the counter-electrodes 1, 2 remote from the plane of conveyance. Contrary to the conventional hypothesis, therefore, the surfaces of the item to be treated with the selected disposition are not traversed with the electrolytic fluid from the greatest possible vicinity, so that it could be expected that, with the selected apparatus, a high-quality borehole electroplating would not be achievable if a high current density were set. Surprisingly, this expectation was not confirmed. It became apparent, in fact, that, despite the relatively large spacing between the electrolyte spraying arrangements and the surfaces of the printed circuit boards or conductor foils, the maximum possible performance of the system in respect of the desired quality of the metal layer, in respect of the layer thickness distribution on the surface and in respect of the deposition velocity is achieved with the selected apparatus. Obviously the disadvantages of local current density variations along the path of conveyance, which arise with conventional electroplating systems, are substantially greater than the disadvantage which arises as a result of the loss of maximum flow velocity of the electrolytic fluid at the surface of the item to be treated. While no electrolyte spraying tubes are placed in the electrolytic chambers 4, 5, but are placed externally of these chambers, and because continuous anode faces are used, a hitherto unattainably uniform current density distribution can be achieved at all of the locations of the plane of conveyance. The composition of the electrolytic fluid can be set in optimum manner to this current density. This also provides an advantage over conventional apparatus since, in these apparatus, a varying current density distribution was achieved, and the composition of the electrolytic fluid could only be optimised approximately to a mean current density value.

The treatment fluid is conveyed to the spraying tubes 13 in the direction of the arrow from a storage vessel by means of at least one pump. The spraying tubes have holes or nozzles 14, which are orientated perpendicularly or inclinedly relative to the surface of the item to be treated. Furthermore, openings 15, preferably holes, are provided in the anodes 1, 2 and are so positioned that treatment fluid, which emerges from the holes or nozzles 14 in the spraying tubes 13, can pass the anodes in a largely or totally unhindered manner so as to permit the surface of the item to be treated to be reached through the electrolytic chambers 4, 5. In consequence, a hole 15 in the anode is situated perpendicularly or inclinedly in front of each hole or each nozzle 14.

The holes or nozzles 14 are preferably situated beneath the bath level 16 in the treatment chamber. The hole diameter is advantageously somewhat larger than the diameter of the spraying tube holes. In practice, it is between substantially four and substantially twelve millimetres. For geometrical reasons, greater openings or holes 15 must be provided in the anodes, more especially when the direction of flow of the electrolyte is inclinedly orientated and also with a greater anode thickness. In this case, inclinedly orientated anode openings or holes could also be provided.

Because of the comparably large spacing between the spraying tubes and the item to be treated, the electrolyte passes through the holes 15 in the anodes 1, 2 in a more uniform manner to a larger surface region of the item to be treated. The spacing between the holes or nozzles 14 of a spraying tube 13 and the spacing between the spraying tubes, when viewed with respect to the direction of conveyance, are preferably so selected that a virtually uniform electrolytic flow pattern is produced on the surface of the item to be treated in the entire plane of conveyance, i.e. transversely relative to the direction of conveyance and also longitudinally relative thereto. In practice, the spacing between spraying tube and item surface is substantially 40 millimetres to 120 millimetres. With large spacings between the holes and spraying tubes, the holes or nozzles 14 are advantageously offset from spraying tube to spraying tube transversely relative to the direction of conveyance. A flow pattern, obtained with these measures, shows that the uniformity of the flow produces, in a surprisingly obvious manner, better electroplating results, even for borehole metallisation, than with maximum and minimum flows, which act alternately along the path of conveyance and are obtained with conventional systems when electrolyte spraying tubes are disposed very close to the surfaces of the items to be treated.

Even when soluble anodes are used, the spraying tubes are disposed externally of the electrolytic chambers 4, 5. In order to achieve an unhindered passage of the electrolytic fluid through the anodes, various measures are taken depending on the type of anode. In the case of pourable anodes, for example spherical anodes, tubes extending from each hole or each nozzle 14 extend through the anode cages, in order to keep the jet path for the treatment fluid free of anode material. The tubes are secured on the respective anode cage. They are so positioned that the electrolyte passes from each nozzle in an unhindered manner through said nozzle into the electrolytic chambers 4, 5. When soluble anode plates are used, appropriate openings in the plates ensure the unhindered passage of electrolyte.

The electrolytic solution, which flows into the electrolytic chambers 4, 5, discharges laterally through structurally necessitated openings along the path of conveyance and enters a storage vessel. Openings may also be provided, which are additionally formed so as to permit the fluid to flow-away.

The outlet region of the continuous system according to the invention is a corresponding mirror image of the inlet region illustrated in FIG. 1. Sealing walls 17 and one or more sealing rollers 18 are provided at the inlet and at the outlet for the printed circuit boards or foils 3. Said walls and rollers serve to retain the electrolytic fluid largely in the system and to prevent it from emerging, while the printed circuit boards or conductor foils are inserted into the system or removed therefrom. In consequence, the bath level 16 is maintained in the system. It is apparent from FIG. 1 that the sealing means have a greater spacing from the nearest anodes. This produces the advantage that a local current density prevails at the first sealing line 19, despite the edge effect produced there, and such density is only substantially as high as the current density internally of the electroplating system.

In the case of electroplating tests with direct current, current densities up to 15 A/dm$^2$ were set with the apparatus according to the invention without the quality of the metal layers being inadequate. Even higher, usable current densities are possible when the electrolyte composition and, more especially, the additives contained in the electrolyte are adapted to the new system concept by optimisation. The continuous system according to the invention is also suitable in an excellent manner for electroplating with bipolar pulse current. Effective current densities of up to 20 A/dm$^2$ were achieved in tests. The pulse electroplating process can be used in a particularly advantageous manner for electroplating very fine boreholes. When conventional electroplating systems are used, the uniform metallisation of such boreholes is particularly problematical.

All of the disclosed features and combinations of the disclosed features are the subject-matter of this invention, provided that such are not expressly referred to as being known.

List of Reference Numerals 1. upperanode
2. lower anode
3. item to be treated (printed circuit board or conductor foil)
4. upper electrolytic chamber
5. lower electrolytic chamber
6. insulating spacer strips, seals
7. upper guide elements
8. lower guide elements
9. spindle
10. disc
11. contacting clip
12. roller contact
13. electrolyte spraying tubes
14. hole, nozzle in the spraying tube
15. openings, holes in the anodes
16. bath level
17 sealing wall
18. sealing rollers
19. sealing line

What is claimed is:

1. Apparatus for electrolytically treating printed circuit boards and conductor foils using an electrolytic fluid, through which apparatus the printed circuit boards or conductor foils are continuously guidable in a plane of conveyance in a substantially horizontal direction of conveyance, said apparatus comprising:

a. a plurality of counter-electrodes disposed opposite the plane of conveyance and substantially parallel thereto on at least one side, so that electrolytic chambers are formed between counter-electrodes, which are situated opposite one another, or between the counter-electrodes and the plane of conveyance, the counter-electrodes forming respective substantially continuous electrode faces;

b. guide elements for the printed circuit boards and conductor foils disposed in the electrolytic chamber;

c. contact elements provided for the electrical contacting of the printed circuit boards and conductor foils;

d. electrolyte spraying arrangements provided for conveying the electrolytic fluid towards the surfaces of the printed circuit boards and conductor foils;

characterised in that openings (15) are provided in the plurality of counter-electrodes (1,2), and the electrolyte spraying arrangements (13) are disposed on the sides of the counter-electrodes remote from the plane of conveyance are adapted for passing electrolytic fluid therethrouah to the surfaces of the printed circuit board or conductor foils, said passing providing a flow of the electrolyte past the counter electrodes substantially unhindered at the location of the openings; and wherein the plurality of counter electrodes are isolated from one another by means of spacer strips and/or seals.

2. Apparatus according to claim 1, characterised in that the openings (15) in the counter-electrodes (1,2) are substantially in alignment with the axes of fluid jets emerging from the electrolyte spraying arrangements (13).

3. Apparatus according to claim 2, characterised in that the axes are orientated substantially perpendicularly relative to the plane of conveyance.

4. Apparatus according to one of the preceding claims, characterised in that a plurality of electrolyte spraying arrangements (13) are disposed both perpendicularly and parallel to the direction of conveyance.

5. Apparatus according to claim 4, characterised in that the electrolyte spraying arrangements (13) are offset from one another when viewed with respect to the direction of conveyance.

6. Apparatus according to claim 4, characterised in that the spacing between the electrolyte spraying arrangements (13) is so dimensioned that the flow velocity of the electrolytic fluid in the plane of conveyance is substantially identical at all of the locations.

7. Apparatus according to one of the preceding claims 1–3, characterised in that the guide elements (7,8) are offset from one another when viewed with respect to the direction of conveyance.

8. Apparatus according to one of the preceding claims, 1–3 characterised in that the guide elements (7,8) are in the form of discs (10), which are disposed on a spindle (9), which extends perpendicularly relative to the direction of conveyance and parallel to the plane of conveyance, the dimensions and the material of said discs being so selected that they do not substantially affect the electrical field line distribution in the electrolytic chambers (4,5).

9. Apparatus according to one of the preceding claims 1–3, characterised in that sealing means (17,18) are provided at the inlet and at the outlet of the apparatus for the printed circuit boards and conductor foils (3) in order to hinder the emergence of fluid, and in that the counter-electrodes (1,2) are disposed so far remote from the sealing means that a current density, adapted to locations in the vicinity of the inlet and of the outlet of the printed circuit boards and conductor foils, is substantially exactly identical to the mean current density between the inlet and the outlet.

* * * * *